United States Patent
Herbig et al.

(10) Patent No.: US 11,817,115 B2
(45) Date of Patent: Nov. 14, 2023

(54) ENHANCED DE-ESSER FOR IN-CAR COMMUNICATION SYSTEMS

(71) Applicant: Cerence Operating Company, Burlington, MA (US)

(72) Inventors: Tobias Herbig, Ulm (DE); Stefan Richardt, Ulm (DE)

(73) Assignee: Cerence Operating Company, Burlington, MA (US)

( * ) Notice: Subject to any disclaimer, the term of this patent is extended or adjusted under 35 U.S.C. 154(b) by 770 days.

(21) Appl. No.: 16/099,941

(22) PCT Filed: Sep. 1, 2016

(86) PCT No.: PCT/US2016/049914
§ 371 (c)(1),
(2) Date: Nov. 8, 2018

(87) PCT Pub. No.: WO2017/196382
PCT Pub. Date: Nov. 16, 2017

(65) Prior Publication Data
US 2019/0156855 A1   May 23, 2019

Related U.S. Application Data

(60) Provisional application No. 62/334,720, filed on May 11, 2016.

(51) Int. Cl.
*G10L 21/0364* (2013.01)
*G10L 25/18* (2013.01)
*H03G 9/02* (2006.01)

(52) U.S. Cl.
CPC .......... *G10L 21/0364* (2013.01); *G10L 25/18* (2013.01); *H03G 9/025* (2013.01)

(58) Field of Classification Search
CPC ..... G10L 19/02; G10L 21/0364; G10L 25/18; H03G 9/025
See application file for complete search history.

(56) References Cited

U.S. PATENT DOCUMENTS

| | | | |
|---|---|---|---|
| 2006/0196337 A1* | 9/2006 | Breebart | G06F 16/683 84/1 |
| 2009/0092261 A1* | 4/2009 | Bard | G06F 1/3287 381/71.1 |

(Continued)

FOREIGN PATENT DOCUMENTS

WO    2017196422 A1    11/2017

OTHER PUBLICATIONS

International Preliminary Report on Patentability for International Application No. PCT/US2016/049914, entitled "Enhanced De-Esser for In-Car Communication Systems," dated Nov. 13, 2018.

(Continued)

*Primary Examiner* — Michael N Opsasnick
(74) *Attorney, Agent, or Firm* — Occhiuti & Rohlicek LLP

(57) ABSTRACT

Methods and systems for deessing of speech signals are described. A deesser of a speech processing system includes an analyzer configured to receive a full spectral envelope for each time frame of a speech signal presented to the speech processing system, and to analyze the full spectral envelope to identify frequency content for deessing. The deesser also includes a compressor configured to receive results from the analyzer and to spectrally weight the speech signal as a function of results of the analyzer. The analyzer can be configured to calculate a psychoacoustic measure from the full spectral envelope, and may be further configured to detect sibilant sounds of the speech signal using the psychoacoustic measure. The psychoacoustic measure can include, for example, a measure of sharpness, and the analyzer may be further configured to calculate deesser weights based on the measure of sharpness. An example application includes in-car communications.

14 Claims, 13 Drawing Sheets
(1 of 13 Drawing Sheet(s) Filed in Color)

(56) References Cited

U.S. PATENT DOCUMENTS

| | | | | |
|---|---|---|---|---|
| 2011/0282654 A1* | 11/2011 | Takechi | ............... | G01M 13/028 704/200.1 |
| 2012/0219157 A1* | 8/2012 | Hosaka | ..................... | G01H 3/08 381/56 |
| 2012/0243702 A1 | 9/2012 | Sandgren | | |
| 2013/0259254 A1* | 10/2013 | Xiang | ................... | G10K 11/175 381/73.1 |
| 2014/0037111 A1* | 2/2014 | Uhle | ........................ | H04R 3/00 381/119 |
| 2014/0163972 A1* | 6/2014 | Tsujino | ................... | G10L 19/03 704/205 |
| 2015/0248889 A1* | 9/2015 | Dickins | ................. | G10L 19/012 704/500 |

OTHER PUBLICATIONS

A-weighting, Wikipedia, www.wikipedia.org/wiki/A-weighting, 9 pages, retrieved from Internet on Nov. 2, 2018.

Wikipedia, Bark scale, https://en.wikipedia.org/wiki/Bark_scale, downloaded on Aug. 31, 2016, 4 pages.

Wikipedia, Lombard effect, https://en.wikipedia.org/wiki/Lombard_effect, downloaded on May 17, 2016, 5 pages.

Zwicker E., and Fastl H., "Psychoacoustics: Facts and Models," pp. 239-241, Springer, 1999.

Wikibooks, "Fundamental of psychoacoustics," Acoustics/Fundamental of Psychoacoustics, https://en.wikibooks.org/wiki/Acoustics/Fundamentals_of_Psychoacoustics, downloaded on May 17, 2016.

Wikipedia, Sibilant, https://en.wikipedia.org/wiki/Sibilant, downloaded on May 17, 2016, 6 pages.

Wikipedia, A-law algorithm, https://en.wikipedia.org/wiki/A-law_algorithm, downloaded May 26, 2016, 2 pages.

Anonymous "compressor gain control principles," Variety of Sound, 6 pages, retrieved from https://varietyofsound.wordpress.com/e009/07/21/compressor-gain-control-principles/, Jul. 21, 2009.

Wolters, et al., "Adaptive Algorithm for Detecting and Reducing Sibilants in Recorded Speech," Presented at the AES 104th Convention, Amsterdam, 9 pages, May 16-19, 1998.

International Search Report and the Written Opinion of the International Searching Authority dated Oct. 21, 2016 for International Application No. PCT/US2016/049914, entitled "Enhanced De-Esser for In-Car Communication Systems".

* cited by examiner

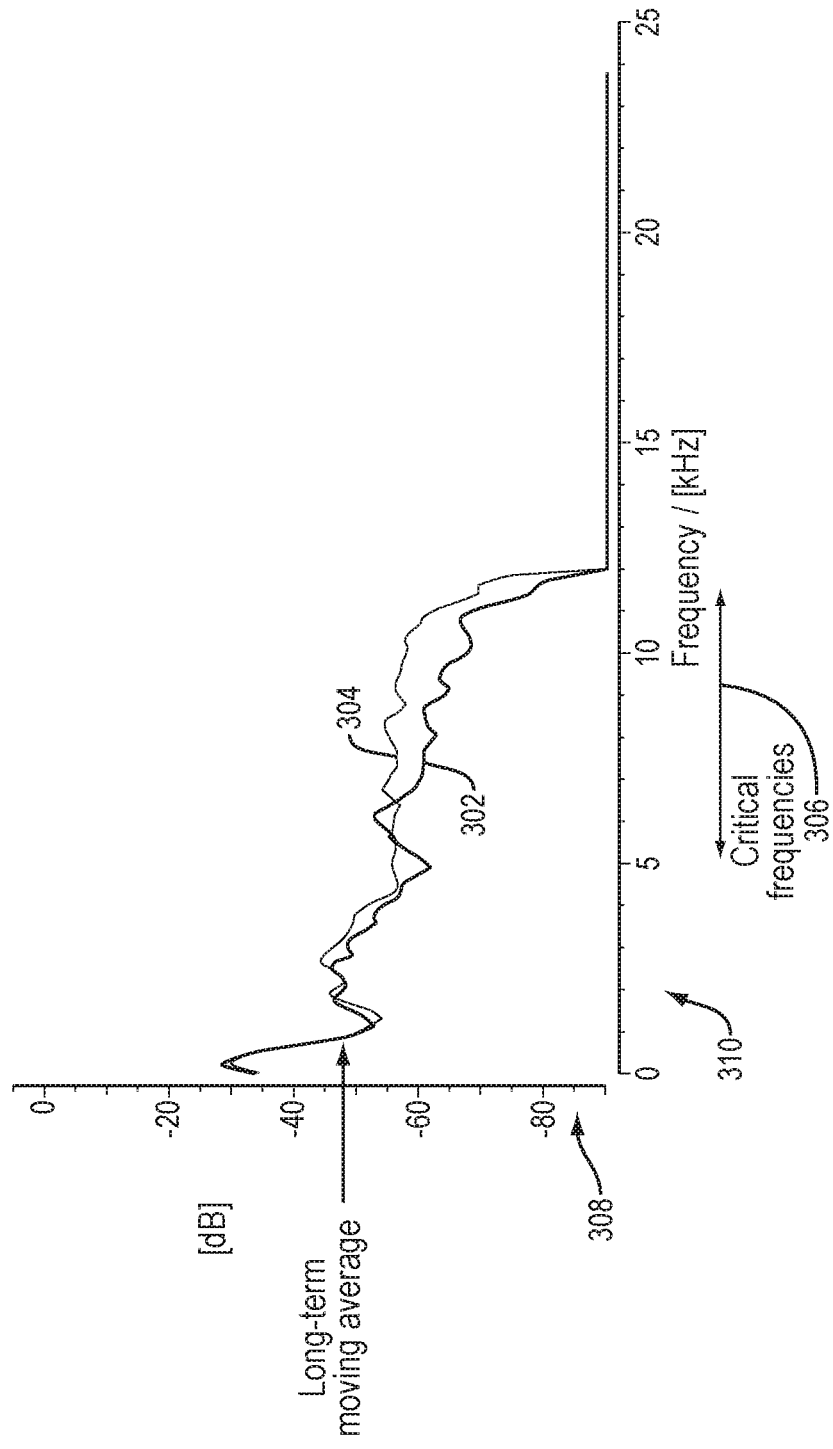

TABLE 1

| z/Bark | f/Hz | z/Bark | f/Hz | z/Bark | f/Hz |
|---|---|---|---|---|---|
| 1 | 100 | 9 | 1080 | 17 | 3700 |
| 2 | 200 | 10 | 1270 | 18 | 4400 |
| 3 | 300 | 11 | 1480 | 19 | 5300 |
| 4 | 400 | 12 | 1720 | 20 | 6400 |
| 5 | 510 | 13 | 2000 | 21 | 7700 |
| 6 | 630 | 14 | 2320 | 22 | 9500 |
| 7 | 770 | 15 | 2700 | 23 | 12000 |
| 8 | 920 | 16 | 3150 | 24 | 15500 |

ENHANCED DE-ESSER FOR IN-CAR COMMUNICATION SYSTEMS

RELATED APPLICATION

This application is the U.S. National Stage of International Application No. PCT/US2016/049914, filed Sep. 1, 2016, which designates the U.S., published in English, and claims the benefit of U.S. Provisional Application No. 62/334,720, filed May 11, 2016. The entire teachings of the above applications are incorporated herein by reference.

BACKGROUND

In-Car Communication (ICC) systems assist passengers to communicate with each other, especially when the passengers cannot face each other directly. For example, the driver has to concentrate on road traffic and cannot turn his head to rear passengers. ICC systems make use of seat-dedicated microphones or an array of microphones to capture the speech signal of the current speaker, perform some speech enhancement, and play back the sound signal via loudspeakers near the listener.

One challenge of such a system is the handling of sibilant sounds, which may be related to specific speaking habits of the current user and strongly speaker dependent. Speaking habits of different speakers generally cannot be considered while tuning the ICC system; hence, the ICC system has to adapt to them. Sibilant sounds may become even more dominant due to the system itself. For example, noise suppression may lead to an over-emphasis of higher frequency bands, which are relevant for the generation of sibilant fricatives.

SUMMARY OF THE INVENTION

Static settings of an equalizer may also have an effect on sibilant sounds. A dynamic method for suppressing annoying sibilant sounds would be useful to improve In-Car Communication (ICC) systems.

A current implementation of a deesser (de-"S"-er) method by the current applicant is based on an attenuation of sibilant sounds based on a long-term average of an upper frequency range (4-12 kHz). A calculation of the adaptive threshold only considers the input signal in this frequency range. Spectral context is not considered sufficiently. Hence, the average attenuation of the upper frequencies is constant without considering speaker characteristics or acoustic scenarios.

Prior deesser approaches are mainly used in scenarios where the speaker and the acoustic scenario are known a priori and where the tuning of the deesser method can be optimized offline. For example, a deesser method is typically used for speakers of broadcast news. The speaker and his/her speaking habits are known a priori, the acoustic scenario can be controlled, and the parameter setting of the deesser method can be optimized using audio samples of this speaker.

In an embodiment of the present invention, the end user of a product is not known, so the deesser method has to work robustly for a variety of speakers and acoustic scenarios, such as an idle state of the car, town traffic and highway, and psychoacoustic effects, such as the Lombard effect, and all scenarios are considered.

Embodiments of the deesser of the present invention employ spectral envelope and phoneme-dependent attenuation. The deesser can use envelope information for (slow) adaption of a threshold.

An embodiment of the deesser method disclosed herein optimizes an objective psychoacoustic measure (e.g., sharpness).

Embodiments of the deesser may be employed in ICC systems. Furthermore, embodiments of the deesser may be utilized in audio plug-ins for standard audio processing, such as in the form of a fully automatic deesser method. Other applications for the deesser are in the area of speech signal enhancement (SSE), where an embodiment of the deesser may be implemented as an independent software module, and in the area of hands-free telephony and mobile dictation. In general, the deesser makes the speech signal more convenient for the human listener. Embodiments may also be useful for speech recognition applications.

Embodiments of the deesser can be part of signal processing and analysis in the frequency domain performed by an ICC system. Additional processing in the frequency domain performed by the ICC system can include feedback suppression, noise suppression, equalizing, noise dependent gain control, multi-band compression, and the like, all of which typically employ low delay signal processing. The deesser can use the same frequency resolution as other signal processing of the system, at least when the spectral weights are applied to the signal. This is but one distinction of the current approach over other deesser implementations, which may be in the time domain.

A method of deessing a speech signal includes, for each time frame of a speech signal presented to a speech processing system, analyzing a full spectral envelope to identify frequency content for deessing, and spectrally weighting the speech signal as a function of results of the analyzing.

Analyzing the full spectral envelope can include calculating a psychoacoustic measure from the full spectral envelope. The analyzing can further include detecting sibilant sounds of the speech signal using the psychoacoustic measure. The psychoacoustic measure can include at least one of a measure of sharpness and a measure of roughness. In an embodiment, the psychoacoustic measure includes a measure of sharpness, and the analyzing further includes calculating deesser weights based on the measure of sharpness.

Spectrally weighting the speech signals can occur in the frequency domain and at a frequency resolution matching that of the full spectral envelope. Embodiments may use typical values for sampling rate, frequency resolution and time frame for analysis, such as 24 kHz sampling rate, approximately 200 Hz frequency resolution, and a time frame for analysis of less than 5 ms.

Further, spectrally weighting the speech signal can include applying deesser weights to sibilant sounds of the speech signal. Deesser weights can be applied to control attack and release of a compressor. While a compressor is normally used to reduce dynamics of a signal, it is here used to reduce sharpness. The compressor can include a soft threshold and a hard threshold, the soft threshold causing the compressor to moderate the further increase in a measure of sharpness for a given ratio R, the hard threshold being a not-to-exceed threshold of the measure of sharpness.

The method of deessing can further include calculating a measure of sharpness without application of deesser weights and calculating another measure of sharpness with application of the deesser weights. Controlling attack and release of the compressor can include, (i) if the measure of sharpness calculated with application of the deesser weights exceeds one of the thresholds of the compressor, adapting the deesser weights according to a gradient-descent method to attack those parts of the spectral envelope that dominate the measure of sharpness, otherwise, (ii) releasing the deesser weights.

A deesser of a speech processing system includes an analyzer configured to receive a full spectral envelope for each time frame of a speech signal presented to the speech processing system, and to analyze the full spectral envelope to identify frequency content for deessing. The deesser also includes a compressor configured to receive results from the analyzer and to spectrally weight the speech signal as a function of results of the analyzer.

The analyzer can be configured to calculate a psychoacoustic measure from the full spectral envelope, and may be further configured to detect sibilant sounds of the speech signal using the psychoacoustic measure. The psychoacoustic measure can include, for example, a measure of sharpness, and the analyzer may be further configured to calculate deesser weights based on the measure of sharpness.

The analyzer can be further configured to calculate at least two measures of sharpness, a measure of sharpness without application of the deesser weights and another measure of sharpness with application of the deesser weights.

A compressor can be provided which is configured to spectrally weight the speech signal by applying deesser weights to sibilant sounds of the speech signal. The compressor can include a soft threshold and a hard threshold. The soft threshold causes the compressor to moderate the further increase in a measure of sharpness for a given ratio R, and the hard threshold is a not-to-exceed threshold of the measure of sharpness.

The compressor can be configured to control attack and release of the compressor by, (i) if the measure of sharpness calculated with application of the deesser weights exceeds one of the thresholds of the compressor, adapting the deesser weights according to a gradient-descent method to attack those parts of the spectral envelope that dominate the measure of sharpness, otherwise, (ii) releasing the deesser weights.

A computer program product includes a non-transitory computer readable medium storing instructions for deessing speech signals, the instructions, when executed by a processor, cause the processor to: for each time frame of a speech signal presented to a speech processing system, analyze a full spectral envelope to identify frequency content for deessing; and spectrally weight the speech signal as a function of results of the analyzing.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 3A is a graph illustrating frequency content of two example speech signals;

DETAILED DESCRIPTION OF THE INVENTION

A description of example embodiments of the invention follows.

In general, the term 'fricative' or 'fricative sound' describes a consonantal speech sound made by forcing the breath through a narrow opening. Sibilance refers to a manner of articulation of fricative consonants, made by directing a stream of air with the tongue towards the sharp edge of the teeth, such as, for example, the consonants at the beginning of the words "sip," "zip," and "ship" (Source: Wikipedia, available at https://en.wikipedia.org/wiki/Sibilant, accessed Aug. 29, 2016).

An embodiment of the invention comprises two aspects: detecting/classifying fricatives as sibilant sounds and modifying a waveform for sibilant sounds. The embodiment uses an approach in the time-frequency domain based on an overlap-add block-processing framework. The embodiment calculates spectral weighting coefficients to be applied to sibilant intervals of user speech. Sibilant sounds are detected using the psychoacoustic measure for sharpness of audio signals. The sharpness measure was originally developed for stationary sounds, but it turned out that the sharpness measure can also be applied on short-term stationary sounds such as sibilant fricatives. In one implementation, some temporal smoothing is applied to an input spectrum, and spectral weighting is applied according to A-weighting to approximate a specific loudness of the sharpness measure. A-weighting is applied to instrument-measured sound levels in an effort to account for the relative loudness perceived by the human ear, as the ear is less sensitive to low audio frequencies. It is employed by arithmetically adding a table of values. (Source: Wikipedia, available at https://en.wikipedia.org/wiki/A-weighting, accessed Aug. 29, 2016.)

Psychoacoustics metrics, such as loudness, tonality, roughness, and sharpness, can provide a way to predict the subjective human sensation associated with a sound.

Loudness measures the sound strength. Loudness can be measured in Sone, and is considered a dominant metric in psychoacoustics.

Tonality is considered a useful metric, as the human ear is very sensible to pure harmonic sounds. Tonality measures the number of pure tones in the noise spectrum.

Roughness describes the human perception of temporal variations of sounds. This metric is measured in *asper*.

Sharpness is linked to the spectral characteristics of the sound. A high-frequency signal, for example, has a high value of sharpness. This metric is measured in Acum.

Figure 1A:
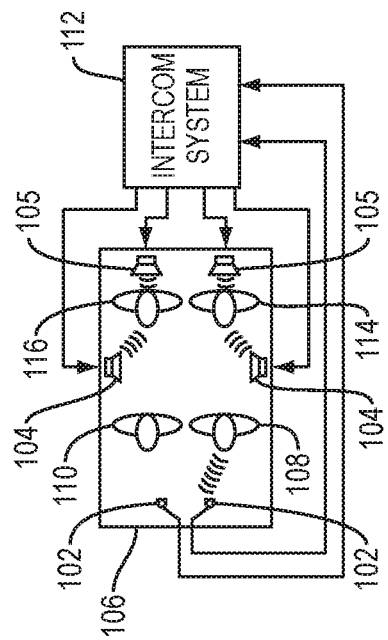
FIG. 1A is a schematic illustration of an example of a one-way (unidirectional) In-Car Communication (ICC) system.

FIG. 1A is a schematic illustration of an example one-way (unidirectional) In-Car Communication (ICC) system 100. The ICC system 100 includes microphones 102 and loudspeakers 104, 105 positioned in the cabin 106 of a vehicle. In the example shown, two microphones 102 are positioned at the front of the cabin 106, two loudspeakers 104 are positioned near the middle of the cabin, and two loudspeakers 105 are positioned at the back of the cabin. The microphones 102 are configured to pick up sound, e.g., speech signals, from a driver 108 of the vehicle and, optionally, a front passenger 110. The microphones 102 and loudspeakers 104, 105 are operatively coupled to a processing system ("Intercom system") 112, which processes speech signals received via the microphones 102 and provides sound output to the passengers 114, 116 in the rear of the vehicle via the speakers 104, 105. In this way, the driver 108 can communicate with the passengers 114, 116 without the need to turn his or her head.

Figure 1B:
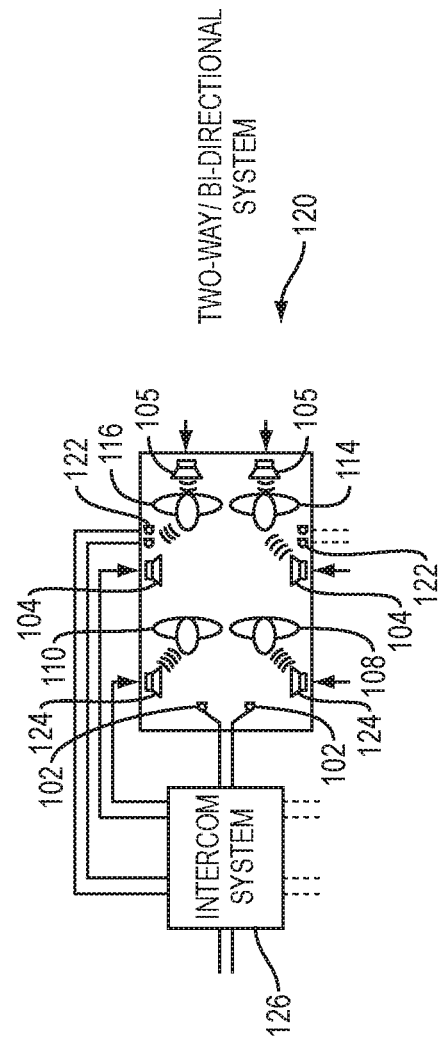
FIG. 1B is schematic illustration of an example of a two-way (bi-directional) ICC system.

FIG. 1B is schematic illustration of an example two-way (bi-directional) ICC system 120. Similar to the system 100 of FIG. 1A, the system 120 includes microphones 102 positioned at the front of the vehicle cabin 106 and loudspeakers 104 and 105 positioned at the middle and rear, respectively, of the vehicle cabin. In addition, the system 120 includes microphones 122 positioned to capture sound, e.g., speech signals, from the rear passengers 114, 116. Sound captured via microphones 122 is processed by processing system ("Intercom system") 126, and processed sound is output to the driver 108 and/or passenger 110 via loudspeakers 124 positioned at the front of the cabin 106. As with processor 112 of system 100, processor 126 of system 120 also processes sound received via microphones 102 and outputs sound to rear passengers via loudspeakers 104, 105. Through appropriate processing of audio signals received through the various microphones, the system 120 enables bi-directional communication between the driver 108, the front passenger 110, and the rear passengers 114, 116. Signal processing performed by processors 112 and 126 can include, for example, feedback suppression, noise suppression, equalizing, noise-dependent gain control, and low delay signal processing.

One challenge of ICC systems, such as systems 100 and 120, is the handling of sibilant sounds, which may be related to specific speaking habits of the current user and can be strongly speaker dependent. Sibilant sounds, which are typically considered annoying to a listener, may become even more dominant due to the processing of sound by system itself. For example, noise suppression may lead to an over-emphasis of higher frequency bands, which are frequency bands relevant for the generation of sibilant fricatives. To reduce the potential negative effect of sibilant sounds on the user(s), ICC systems 100 and 120 may be configured to implement deessing methods and systems according to embodiments of the present invention.

Figure 2:
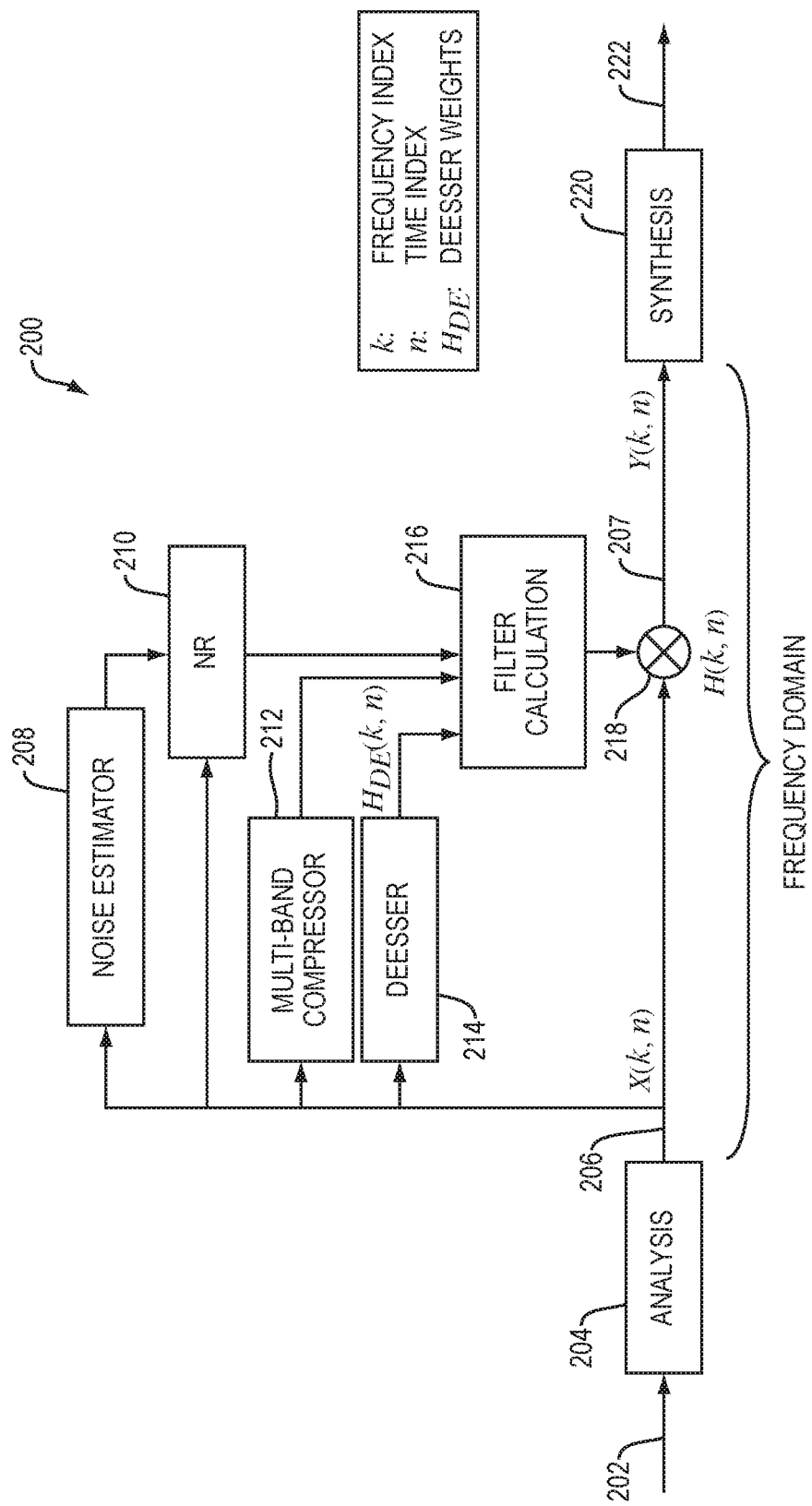
FIG. 2 is a block diagram of an example signal processing method of an ICC system, which may be implemented in software, hardware, or a combination of software and hardware.

FIG. 2 is a block diagram of an example signal processing method and system useful for implementation in an ICC system. System 200 includes an analysis module 204 that receives a speech signal 202 and outputs a speech signal representation 206 in the frequency domain, X(k, n), where k is a frequency index, n is a time index. Additional processing modules of the system 200 in the frequency domain include a noise estimator 208, a noise reduction (NR) module 210, a compressor 212, which can be a multi-band compressor, and a deesser 214, all of which receive the signal X(k, n) as an input. A filter calculation module 216 receives inputs from the noise reduction module 210, multi-band compressor 212 and deesser 214, including deesser weights $H_{DE}(k, n)$. The filter calculation module 216 produces filter coefficients H(k, n) which are applied at 218 to the signal X(k, n) in the frequency domain to produce output signal Y(k, n). A synthesis module 220 converts the filtered signal Y(k, n) from the frequency domain to the time domain resulting in output signal 222.

The method and system of FIG. 2 may be implemented in software, hardware, or a combination of software and hardware. The choice of implementation can depend on the particular application.

FIG. 3A is a graph illustrating frequency content of two example speech signals. Here, estimates of the frequency content for two examples of the sibilant sound /s/ are shown. The two speech samples are from the same speaker. One /s/ sound was perceived as sibilant and therefore annoying whereas the other one was perceived as "normal". A long term moving average was used to estimate the frequency content. Signal energy is represented with a logarithmic amplitude axis in decibels (dB), 308 (y axis), and plotted as a function of linear frequency in kHz, 306 (x axis). In a frequency region of about 4 kHz to about 12 kHz, identified as critical frequencies 306, the first signal 302 and second signal 304 differ in amplitude (power), the second signal tending to have a higher amplitude. The critical frequency range typically depends on the tuning of the system. The lower frequency limit of the frequency range should be set in a range of about 3 kHz to about 4 kHz. In the example shown, the Nyquist frequency (in this case 12 kHz) was used for the upper limit.

Figure 3B:
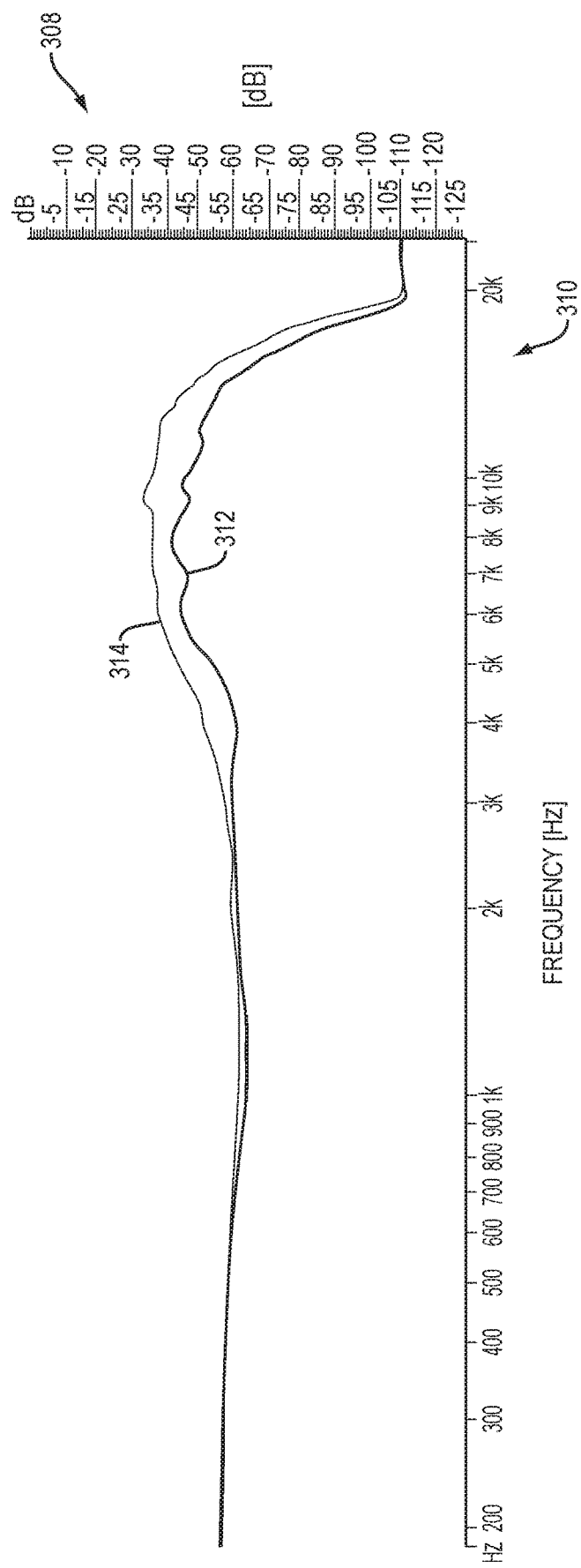
FIG. 3B is a graph illustrating frequency analysis of two example speech signals.

FIG. 3B is a graph illustrating frequency content of another two example speech signals. Signal energy is represented with a logarithmic amplitude axis in decibels (dB), 308 (y axis), and plotted as a function of frequency in kHz, 306 (x axis). In contrast to FIG. 3A, a logarithmic frequency scale is used in FIG. 3B. In general, peaks at higher frequencies may be seen as one indicator for sibilant sounds. In this figure, peaks are not the primary concern. For both sounds 312 and 314, the energy located at lower frequencies, e.g., less than 3 kHz, is more or less the same but the energy located at higher frequencies, e.g., greater than 3 kHz, is much higher for 314 than for 312. This is why the one sound, 314, is perceived as more sharp than the other, 312.

The example signals of FIGS. 3A and 3B may be analyzed with a prior implementation of a deesser method that uses an attenuation of sibilant sounds based on a long-term moving average of an upper frequency range (4-12 kHz). In the prior approach, a calculation of the adaptive threshold for the deesser only considers the input signal in this upper frequency range. Unlike in embodiments of the present inventions, spectral context is not considered sufficiently over the full spectral envelope. In the prior approach, a sudden increase in signal power with respect to a long-term average is attacked in each frequency band separately without any knowledge of the full spectral context. Hence, the average attenuation of the upper frequencies may be constant without considering speaker characteristics or acoustic scenarios.

Figure 4A:
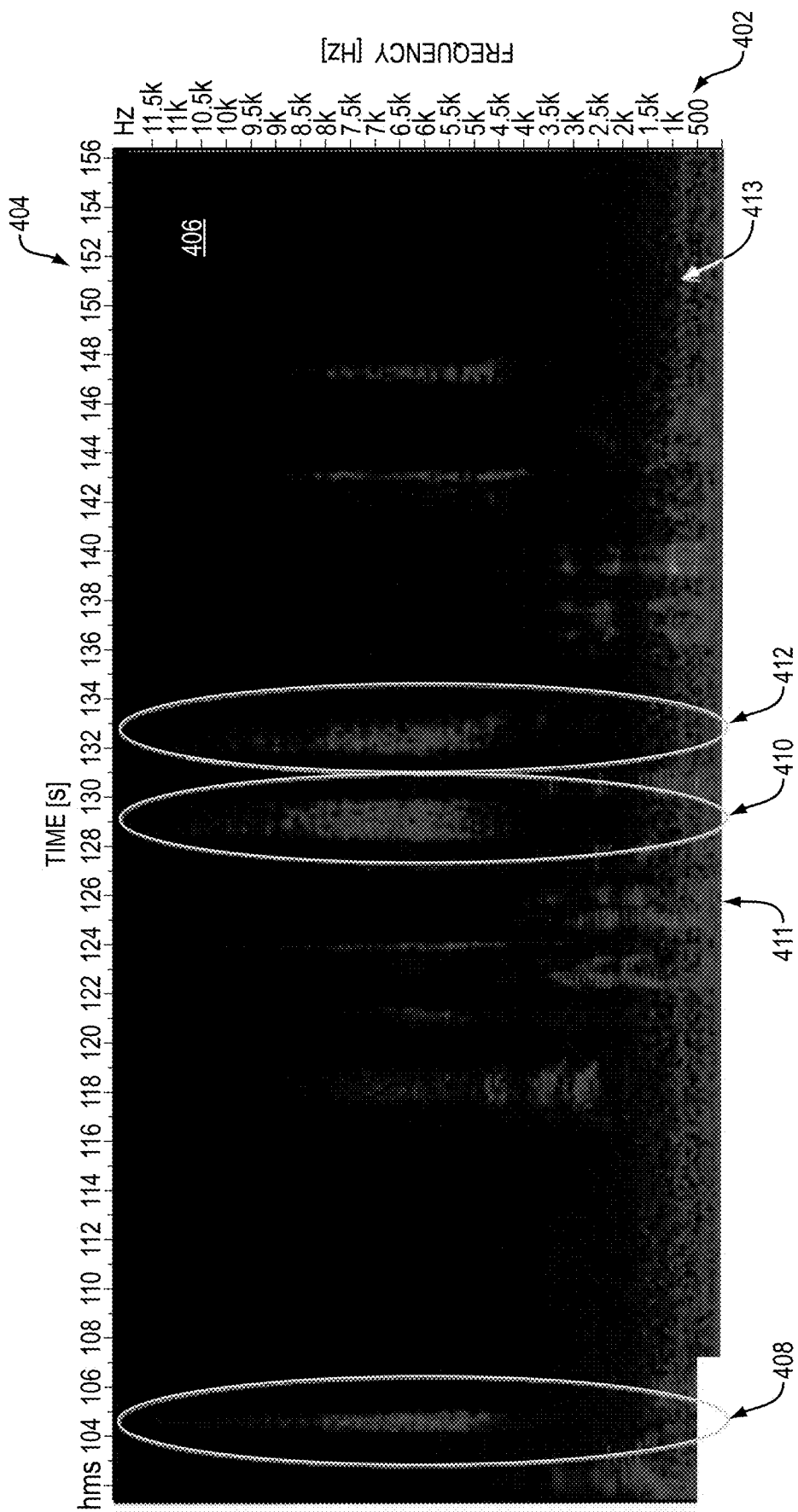
FIG. 4A is a spectrogram of an example speech signal illustrating vowel and fricative sounds.

FIG. 4A is a spectrogram of an example speech signal illustrating vowel and fricative sounds. The spectrogram is a visual representation of the frequency spectrum of sound as a function of time. In the figure, frequency in Hz in plotted on the y axis 402, time in seconds on the x axis 404 and the amplitude (power) of the sound at a particular frequency at a particular time is represented by color 406, the higher the amplitude, the lighter the color. The speech signal includes regions (time frames) with vowel sounds (vowel speech), regions with fricative sounds (fricative speech), as well as other regions.

The spectrogram of FIG. 4A illustrates a speech signal of a speaker's voice recorded in a car. The recording was done in the presence of automotive background noise and music at low volume level. This is a more realistic scenario for ICC as compared to, for example, clean speech without noise. Background noise is present throughout the recording, as illustrated at 413. Examples of sibilant sounds 408, 410, and 412 can be found at the following time instances: approximately 10.4-10.5 seconds, approximately 12.8-13 seconds and approximately 13.2-13.3 seconds. As shown, a vowel sound at 411 can be distinguished from sibilant sound at 410 based on the time and frequency distribution of power in the signal. Regions with vowel sounds tend to have power concentrated below 4 kHz. As can be seen at 410, the sibilant sound comparatively has power distributed over a range of frequencies, up to and above 10 kHz, and less power below 4 kHz. Fricatives and vowels generally do not occur at the same time, as can be seen in FIG. 4A. Therefore, the lower frequencies (less than approximately 3 kHz) tend to be masked by background noise, in particular in case of a fricative. This can be considered by an embodiment of the deesser. For example, the deesser may attack some sibilant sounds in clean speech but not when mixed with noise recorded on a highway since fricatives may be perceived less annoying in the second case. Therefore, embodiments of the present invention are also able to adapt to different acoustic environments. Embodiment may consider other phenomena. For example, when speech is mixed with noise, the Lombard effect may lead to an increase in speech volume as well. The Lombard effect (or Lombard reflex) refers to the involuntary tendency of speakers to increase their vocal effort (loudness, pitch, etc.) when speaking in an environment with loud noise in order to enhance the audibility of their voice (Source: Wikipedia, https://en.wikipedia.org/wiki/Lombard_effect, accessed Aug. 29, 2016).

Figure 4B:
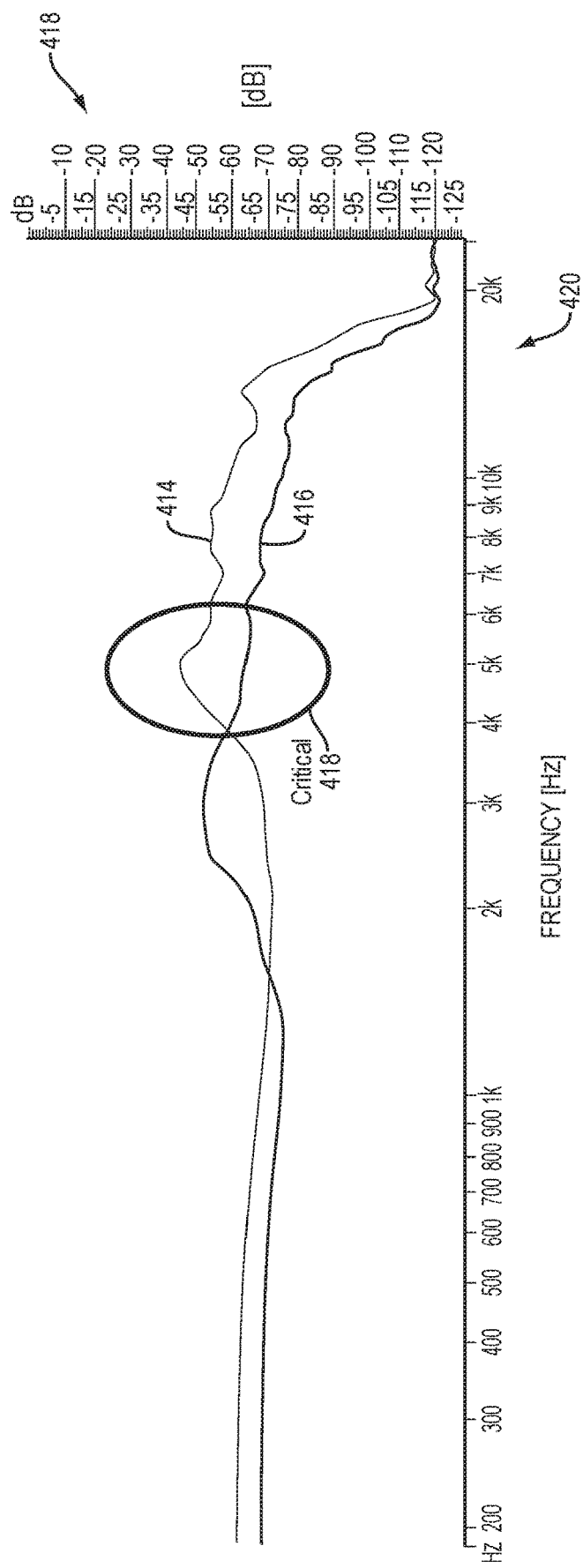
FIG. 4B is a graph illustrating frequency analysis of portions of a speech signal.

FIG. 4B is a graph illustrating frequency analysis of portions of a speech signal. Shown are frequency plots of signals 414 and 416 corresponding to two different regions of a clean (noise-free) speech signal. The first signal 414 and second signal 416 differ in frequency content, the first signal tending to have a higher amplitude relative to the second signal at frequencies above about 4 kHz. As shown, in a frequency region of about 4 kHz to about 6 kHz, identified in the figure as critical region 418, the first signal 414 has a local peak in the frequency content. Signals 414 and 416 also exhibit differences in amplitude at other frequency bands.

FIGS. 4A and 4B illustrate that analyzing speech signals over the full spectral envelope, as opposed to focusing on limited frequency band as in prior approaches, and analyzing the signals in context, as opposed to using time-averaging, can be beneficial for distinguishing different parts of the speech signals, and, in particular, for identifying sibilant sounds. Embodiments of the present approach analyzing the full spectral envelope of a speech signal to identify frequency content for deessing. Further, analysis of the speech signal can be based on a psychoacoustic measure, e.g., sharpness, to detect sibilant sounds and calculate deessing weight based on sharpness.

Embodiments use a measure of sharpness of sound that has been proposed by Zwicker and Fastl in 1999 (Zwicker E and Fastl H, "Psychoacoustics: Facts and Models," pp. 239-241, Springer 1999). The measure can be calculated as follows:

$$S = 0.11 \frac{\int_0^{24\,Bark} N'g(z)z\,dz}{\int_0^{24\,Bark} N'dz} acum$$

with the following parameters:
S: sharpness in Acum
N': specific loudness (of Bark band) in Sone
g(z): weighting factor
z: critical-band rate in Bark (1 Bark=100 Mel)

Figures 5A, 5B:
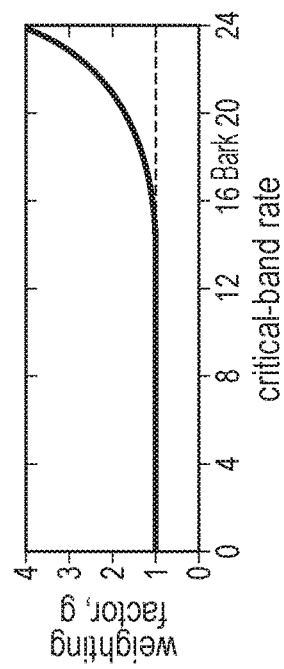
FIG. 5A is a graph illustrating a weighting factor as a function of critical-band rate for use in calculating a sharpness measure according to Zwicker and Fastl 1999.
FIG. 5B illustrates mapping into frequency bands of frequency range according to the Bark scale.

FIG. 5A illustrates weighting factor g(z) for the sharpness measure S as a function of critical-band rate (adapted from Zwicker and Fastl 1999). As can be seen, at critical band rates of about 14 Bark or less, the weighting factor g is 1. At critical band rates higher than about 14 Bark, the weighting factor g increases, effectively boosting the measure of sharpness measure S at higher band rates.

FIG. 5B illustrates mapping into frequency bands of frequency range according to the Bark scale. The Bark scale is a psychoacoustic scale proposed by Eberhard Zwicker in 1961 (Zwicker, E., "Subdivision of the audible frequency range into critical bands," The Journal of the Acoustical Society of America, Volume 33, Issue 2, pp. 248-248. 1961). The scale ranges from 1 to 24 Bark and corresponds to the first 24 critical bands of hearing. Table 1 presented in FIG. 5B shows the frequency bands (Source: Wikipedia, https://de.wikipedia.org/wiki/Bark-Skala, accessed Aug. 29, 2016). To convert a frequency f (Hz) into Bark (z), one can use the following relationship:

$$z = 13 * \arctan(0.00076\,f) + 3.5 * \arctan\left(\frac{f}{7500}\right)^2$$

The above equation is considered a useful approximation of the frequency mapping. Other frequency mappings are known and may be used.

Figure 6:
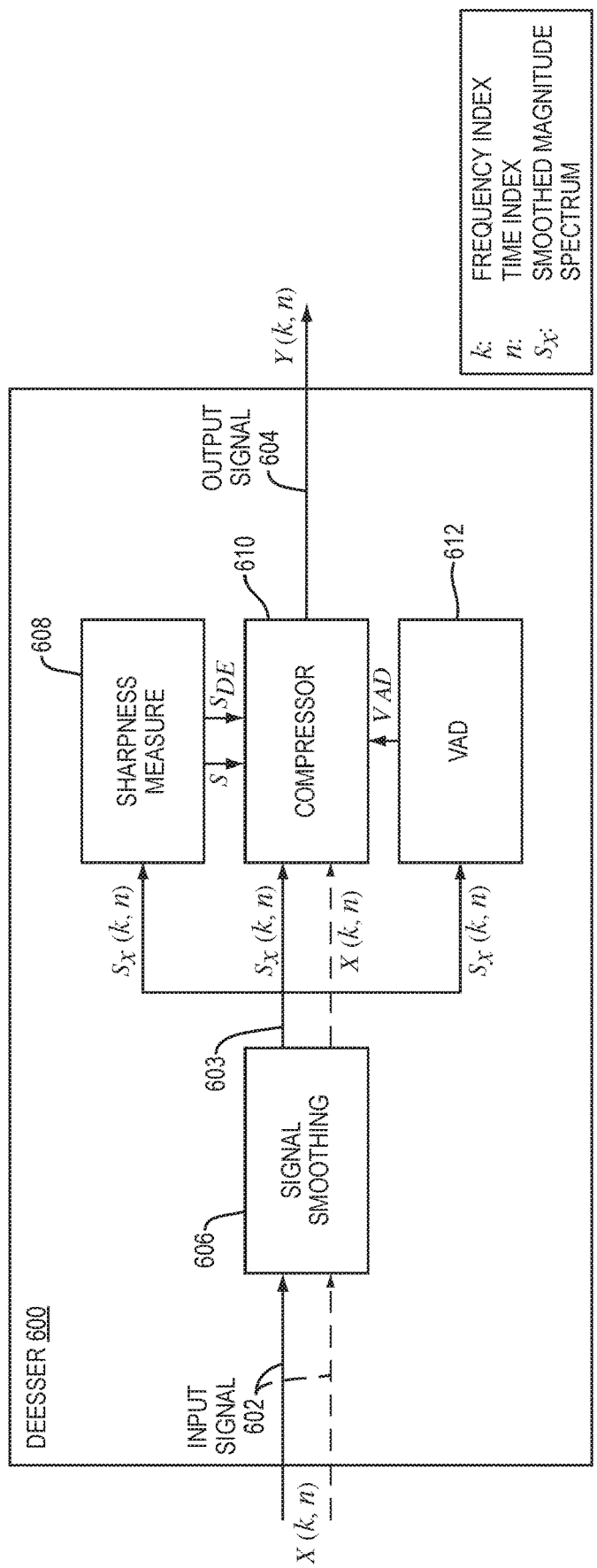
FIG. 6 is a block diagram illustrating an example implementation of a deesser using a sharpness measure according to an embodiment of the present invention.

FIG. 6 is a block diagram illustrating an example implementation of a deesser 600 according to an embodiment of the present invention. The deesser 600 receives an input 602, e.g., a speech signal X(k, n) with frequency index k and time index n, and produces an output 604, e.g., a processed speech signal Y(k, n) in the frequency domain. The input signal 602 in the frequency domain is passed to a signal smoothing module 606, which produces as an output 603 a smoothed magnitude spectrum $S_x(k, n)$. Also, as illustrated with dashed arrows, the input signal 602 is passed through to a compressor 610. The compressor 610 receives the smoothed input signal 603 and the unaltered (looped-through) input signal 602. A sharpness measure module 608 is provided and determines at least one sharpness measure from the smoothed magnitude spectrum $S_x(k, n)$. As shown, two sharpness measures, $S$ and $S_{DE}$ are determined, where $S$ is a sharpness measure calculated without deesser weights and $S_{DE}$ is a sharpness measure calculated including deesser weights. The sharpness measures $S$ and $S_{DE}$ are provided to a compressor 610 that operates on the inputs $S_x(k, n)$ and $X(k, n)$ to produce the output signal $Y(k, n)$. The compressor 610 is gated by voice activity detection (VAD) module 612, which ensures that the compressor is applied only to voice portions of the input signal. The VAD module 612 detect voice portions from the smoothed magnitude spectrum $S_x(k, n)$ of the input signal and sends a control signal (VAD signal) to the compressor 610. In general, any method to detect voice activity may be used. For example, VAD module 612 can employ a simple threshold for the signal-to-noise ratio to detect voice activity. Other, more advanced methods for detecting voice activity may be used, such as the VAD method described in U.S. Provisional Application No. 62/338,884, filed on May 19, 2016, entitled "Voice Activity Detection Feature Based on Modulation-Phase Differences" (Attorney Docket No.: 4765.1066-001), the relevant teachings of which are incorporated herein by reference in their entirety. Additional features of compressor 610 are described below with reference to FIG. 7. An example implementation of a sharpness measure for use in sharpness module 608 of FIG. 6 is described next.

A sharpness measure including deesser weights can be calculated according to the following equation:

$$S_{DE}(n) = 0.11 * \frac{\sum_k [S_x(k, n) * H_{DE}(k, n)]^2 * p(z_k) * z_k}{\sum_k [S_x(k, n) * H_{DE}(k, n)]^2}$$

with the following parameters:
k: frequency index
n: time index
$z_k$: Bark scale corresponding to frequency index k
$S_x$: smoothed magnitude spectrum
$H_{DE}$: deesser weights A sharpness measure excluding deesser weights can be calculated according to the following equations:

$$S(n) = 0.11 * \frac{\sum_k [S_x(k, n)]^2 * p(z_k) * z_k}{\sum_k [S_x(k, n)]^2}$$

Thus, S(n) (or simply S) can be considered the sharpness of the signal before deessing and $S_{DE}(n)$ (or simply $S_{DE}$) can be considered the sharpness after the signal is processed by the deesser.

In an embodiment, the sharpness measure is calculated without and with the spectral weighting of a deesser method or system, which is useful for controlling attack and release behavior of a compressor as follows:

As soon as the sharpness measure exceeds a pre-determined threshold and voice activity is detected, a compressor is calculated under an objective to attack sibilant sounds. Two thresholds are used: a first threshold ($\vartheta_{soft}$) triggers the compressor to moderate the further increase in sharpness for a given ratio. For example, if the sharpness S (without the deesser applied) of the input signals increases by 50%, the deesser method targets to limit the increase in sharpness $S_{DE}$ (with the deesser applied) to 25%. The limit in increase can be set by a ratio parameter R. A second threshold ($\vartheta_{hard}$) may be interpreted as an absolute threshold that should not be exceeded after the compressor. If the sharpness with the deesser, $S_{DE}$, exceeds one of the thresholds, the spectral weighting coefficients of the deesser are adapted according to a gradient-descent method in order to attack especially those parts of the input spectrum that dominate the sharpness of the audio signal. Otherwise, the spectral weights are released, e.g., by applying a multiplicative increase. Typically, a compressor is used to reduce dynamics of a signal. Here, the compressor is used to reduce sharpness of an input signal.

Figure 7:
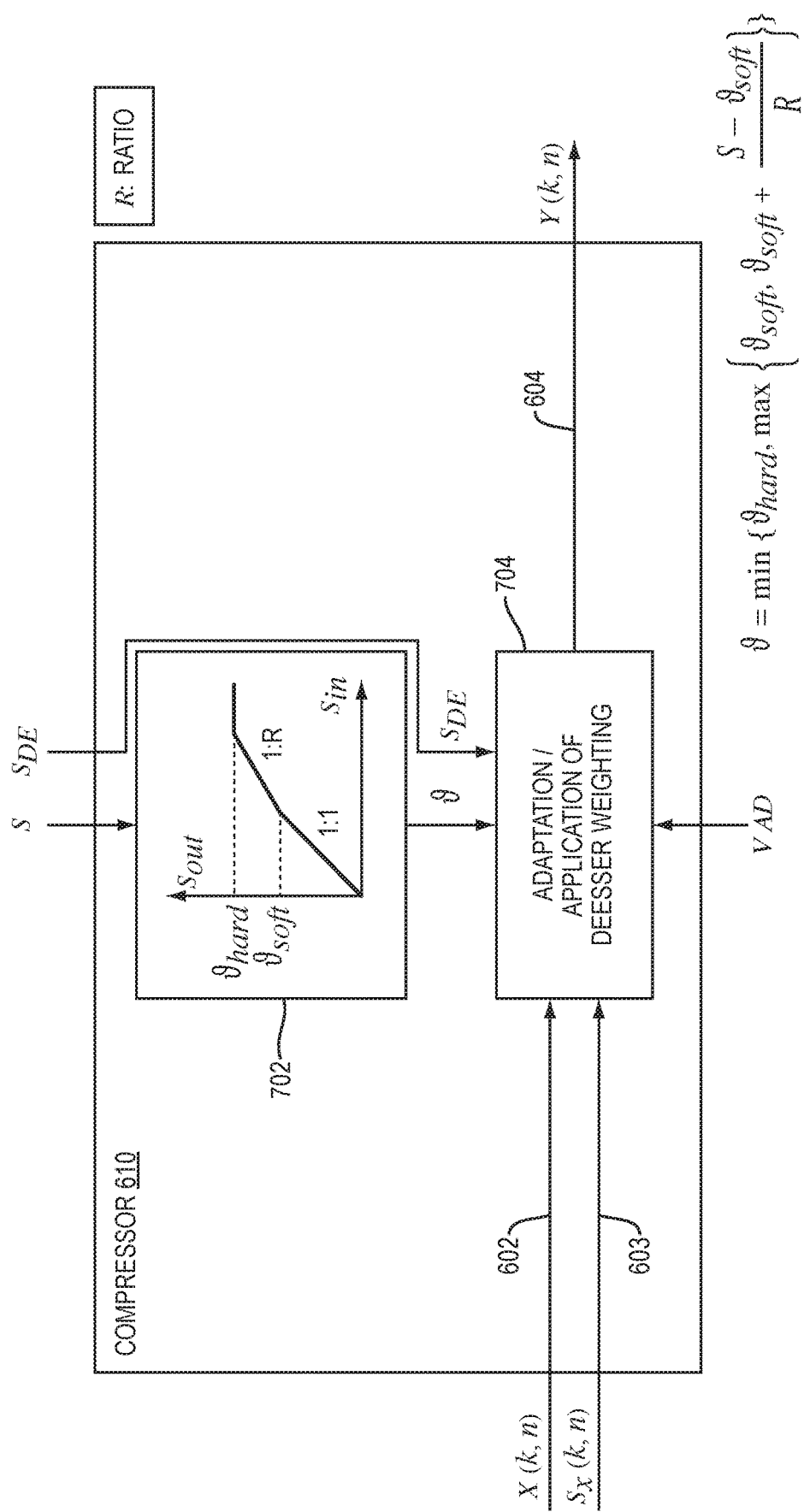
FIG. 7 is a block diagram illustrating a compressor for use with an embodiment of the present invention.

FIG. 7 is a block diagram illustrating a compressor for use with an embodiment of the present invention, such as compressor 610 of deesser 600 of FIG. 6. The sharpness measures S and $S_{DE}$ are provided to compressor 610, which operates on the inputs $S_x(k, n)$ and $X(k, n)$ to produce the output signal $Y(k, n)$. As described above, the compressor 610 is gated by voice activity detection (VAD) module 612, which ensures that the compressor is applied only to voice portions of the input signal. The compressor 610 is configured to spectrally weight the speech signal by applying deesser weights to sibilant sounds of the speech signal.

As shown in FIG. 7, the compressor 610 includes a threshold module 702 that receives sharpness measure S and outputs an instantaneous threshold based on a soft threshold $\vartheta_{soft}$ and a hard threshold $\vartheta_{hard}$. The soft threshold causes the compressor to moderate the further increase in a measure of sharpness for a given ratio R, and the hard threshold is a not-to-exceed threshold of the measure of sharpness. Here, the instantaneous threshold $\vartheta$ is given by:

$$\vartheta = \min\left\{\vartheta_{hard}, \max\left\{\vartheta_{soft}, \vartheta_{soft} + \frac{S - \vartheta_{soft}}{R}\right\}\right\}$$

The compressor 610 includes an adaptation module 704 configured to control attack and release of the compressor based on the sharpness $S_{DE}$ and the instantaneous threshold $\vartheta$ obtained from the threshold module 702. If the measure of sharpness calculated with application of the deesser weights exceeds one of the thresholds of the compressor, the adaptation module 704 adapts the deesser weights according to a gradient-descent method to attack those parts of the spectral envelope that dominate the measure of sharpness, otherwise, the adaptation module 704 releases the deesser weights. An example adaptation process is described below.

Figure 8:
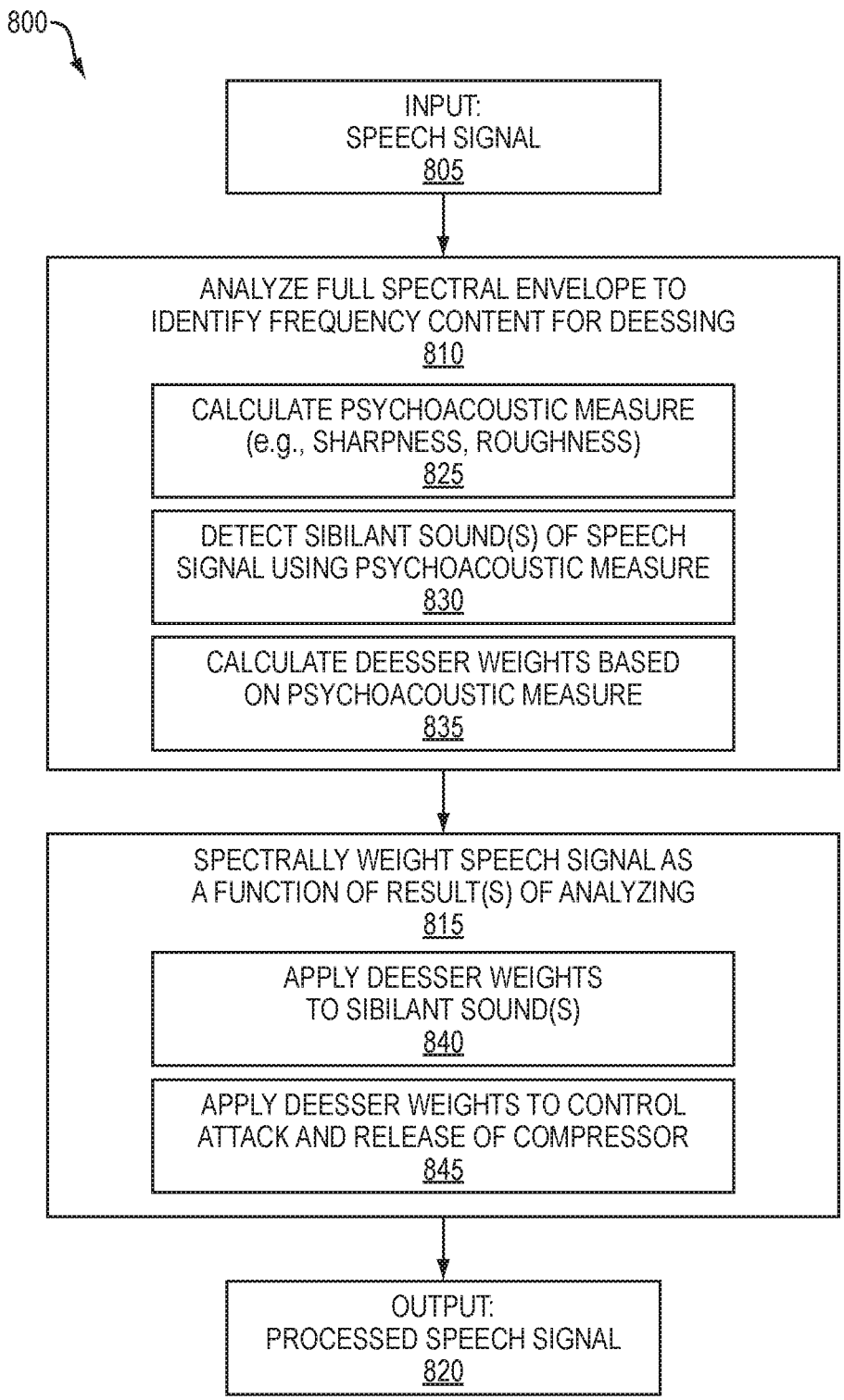
FIG. 8 is a flow chart illustrating a method of deessing a speech signal.

FIG. 8 is a flow chart illustrating a method 800 of deessing a speech signal. A speech signal is presented as an input 805 to a speech processing system. Next, at 810, for each time frame of the speech signal, a full spectral envelope is analyzed to identify frequency content for deessing. At 815, the method performs spectrally weighting the speech signal as a function of results of the analyzing. Preferably, spectrally weighting the speech signals occurs in the frequency domain and at a frequency resolution matching that of the full spectral envelope. An output 820 of the method 800 is a processed speech signal.

As shown at 825, analyzing the full spectral envelope can include calculating a psychoacoustic measure, such as sharpness and roughness, from the full spectral envelope. The analyzing can further include detecting sibilant sounds of the speech signal using the psychoacoustic measure, as shown at 830. As shown at 835, the analyzer can further include calculating deesser weights based on the psychoacoustic measure. For embodiments where the psychoacoustic measure is a measure of sharpness, the analyzing can include calculating deesser weights based on the measure of sharpness.

As shown at 840 in FIG. 8, spectrally weighting the speech signal can include applying deesser weights to one or more sibilant sounds of the speech signal. Optionally, at 845, deesser weights can be applied to control attack and release of a compressor. The compressor can include a soft threshold and a hard threshold as described above with reference to FIG. 7. The soft threshold can cause the compressor to moderate the further increase in a measure of sharpness for a given ratio R, as described above. The hard threshold can be considered a not-to-exceed threshold of the measure of sharpness.

An example process for adaptation of deesser weights includes the following procedural elements:

(i) Attack if ($S_{DE} > \vartheta$) and (VAD==1):

Apply gradient descent according to the following equation:

$$H_{DE}(k, n+1) = \max\left\{H_{DE,\min}, H_{DE}(k, n) - \gamma * \frac{\delta}{\delta H_{DE}(k, n)} S_{DE}(n)\right\}$$

with constant or adaptive step size $\gamma$
and gradient $$\frac{\delta}{\delta H_{DE}(i, n)} S_{DE}(n) = 0.22 * [S_x(k, n)]^2 * H_{DE}(i, n) * \frac{z_i - S_{DE}(n)}{\sum_k [S_x(k, n) * H_{DE}(k, n)]^2}$$

where $$i = 1, \ldots, k, \ldots, \frac{N_{FFT}}{2} + 1,$$

and $N_{FFT}$ denotes number of points of the Fast Fourier Transform (FFT) used in the spectral estimation. The gradient, as expressed above, is automatically determined by the signal.

(ii) Else release:

$$H_{DE}(k,n+1) = \min\{1, H_{DE}(k,n) * g_{inc}\} \text{ with } g_{inc} > 1$$

where $g_{inc}$ is a multiplicative increase factor. Here, $g_{inc}$ is used to reset the deesser weights when no attenuation of fricatives is needed.

The deesser weights $H_{DE}(k, n)$ are then applied to the input signal X(k, n) to produce output Y(k, n) as follows:

$$Y(k,n) = X(k,n) * H_{DE}(k,n)$$

The application of deesser weights is similar to the application of filter coefficients illustrated in FIG. 2.

In the above-described process, the deesser weights are updated for each time frame where the condition of updating the filter coefficients is fulfilled.

The step size $\gamma$ for use in the gradient-descent may be carefully chosen. Although a theoretical approach exists on how to optimize the step size, in practice this approach tends to be too expensive computationally. Typically, one can initially use a constant value, e.g., 0.01, for the step size and then tune this value, for example, depending on a measure of performance of the deesser. It has been observed, for example, that if the step size is too small, the deesser may react too slowly and may miss the fricative that should be attacked. If the step size is large, the deesser may not converge to a stable solution and may be too aggressive. In practice, a step size can be chosen such that the deesser is able to moderate sibilant sounds but does not suppress them completely.

Figure 9:
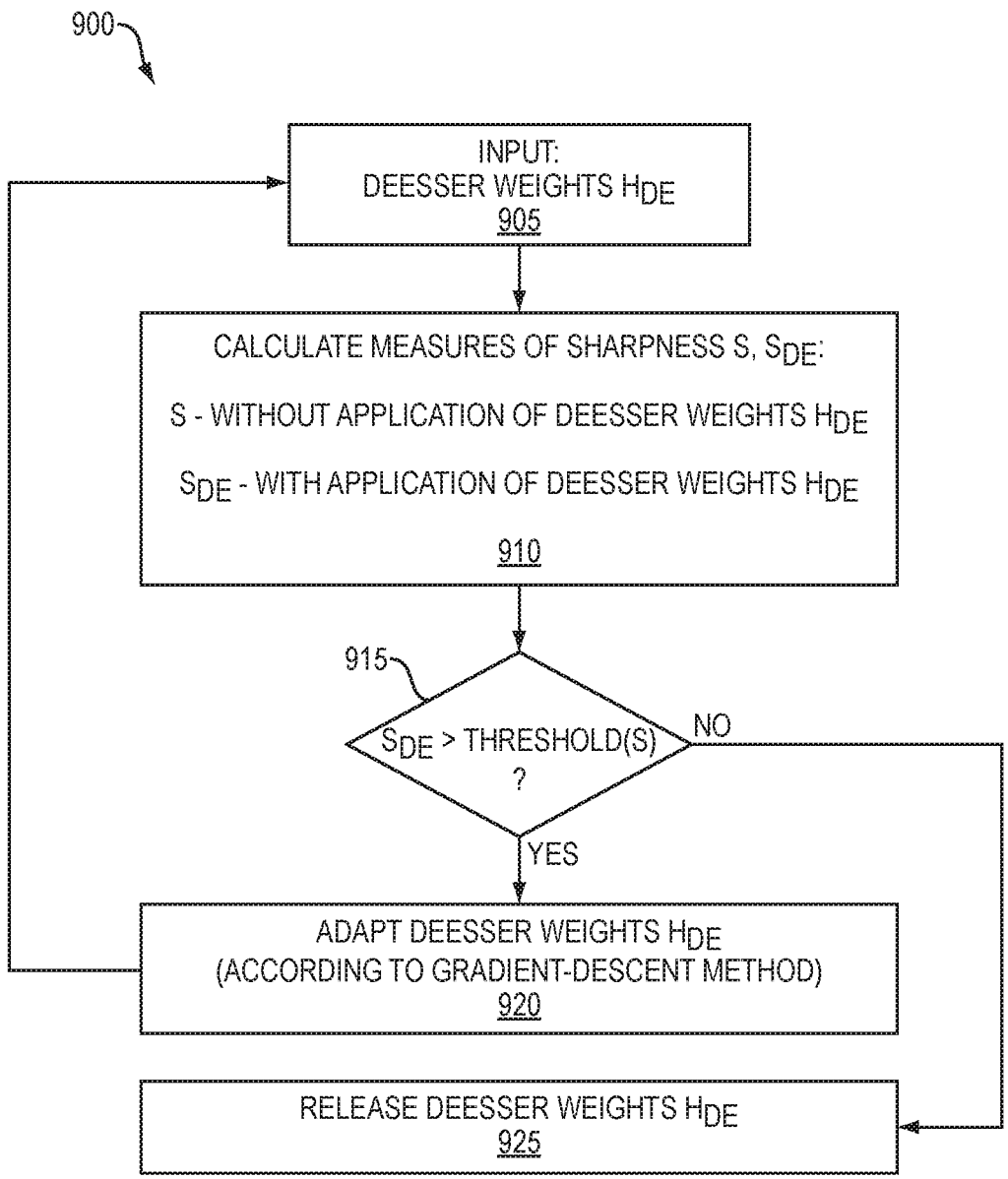
FIG. 9 is a flow chart illustrating a method of adapting deesser weights.

FIG. 9 is a flow chart illustrating a method 900 of controlling the attack and release of the compressor including adapting deesser weights. At 905, deesser weights $H_{DE}$ are provided as input to the method. At 910, two measures of sharpness are calculated. A measure of sharpness S is calculated without application of deesser weights $H_{DE}$, and another measure of sharpness SDE is calculated with application of the deesser weights $H_{DE}$. At decision point 915, the measure of sharpness calculated with application of the deesser weights is compared to the thresholds of the compressor. If the measure of sharpness calculated with application of the deesser weights exceeds one of the thresholds of the compressor, the method proceeds to 920, where it adapts the deesser weights according to a gradient-descent method to attack those parts of the spectral envelope that dominate the measure of sharpness. Otherwise, the method proceeds to 925, where it releases the deesser weights $H_{DE}$.

Figure 10:
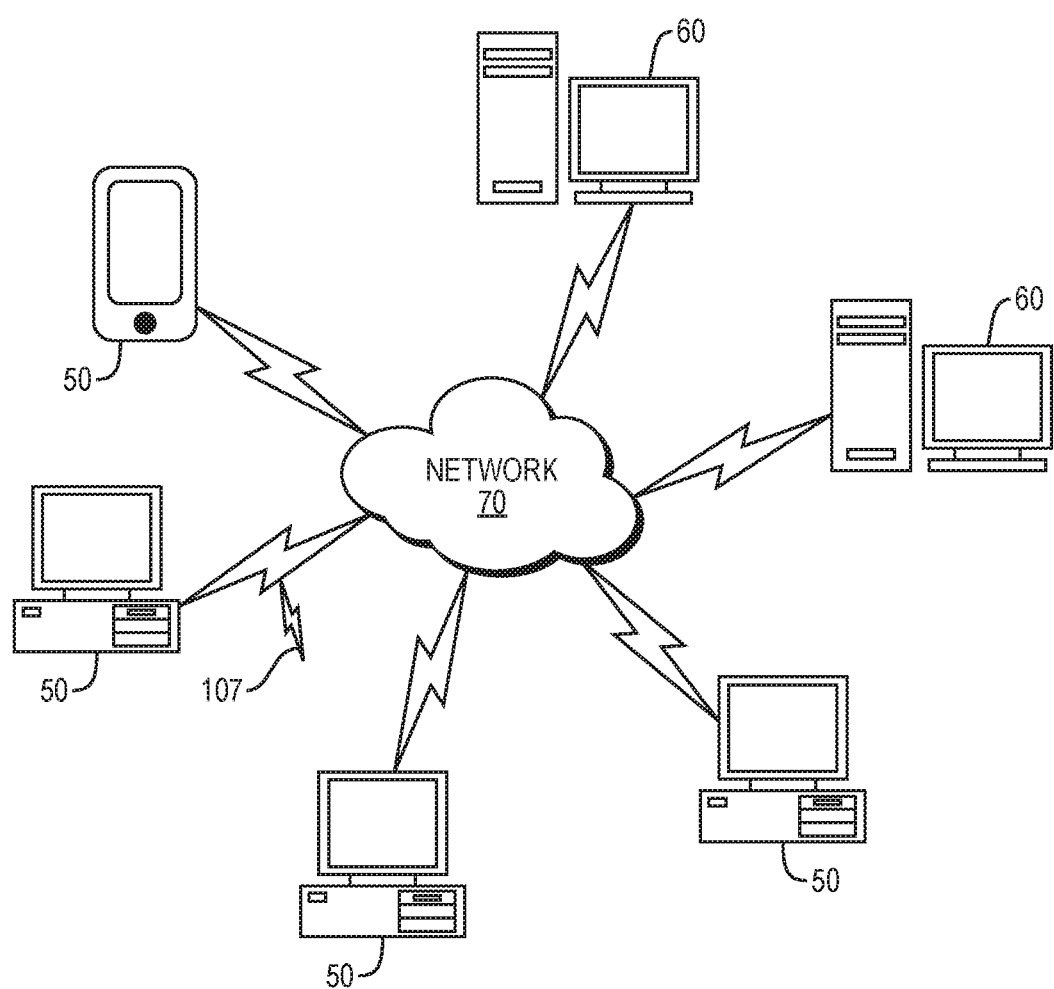
FIG. 10 is a network diagram illustrating a computer network or similar digital processing environment in which embodiments of the present invention may be implemented.

FIG. 10 illustrates a computer network or similar digital processing environment in which embodiments of the present invention may be implemented.

Client computer(s)/devices 50 and server computer(s) 60 provide processing, storage, and input/output devices executing application programs and the like. The client computer(s)/devices 50 can also be linked through communications network 70 to other computing devices, including other client devices/processes 50 and server computer(s) 60. The communications network 70 can be part of a remote access network, a global network (e.g., the Internet), a worldwide collection of computers, local area or wide area networks, and gateways that currently use respective protocols (TCP/IP, BLUETOOTH®, etc.) to communicate with one another. Other electronic device/computer network architectures are suitable.

Figure 11:
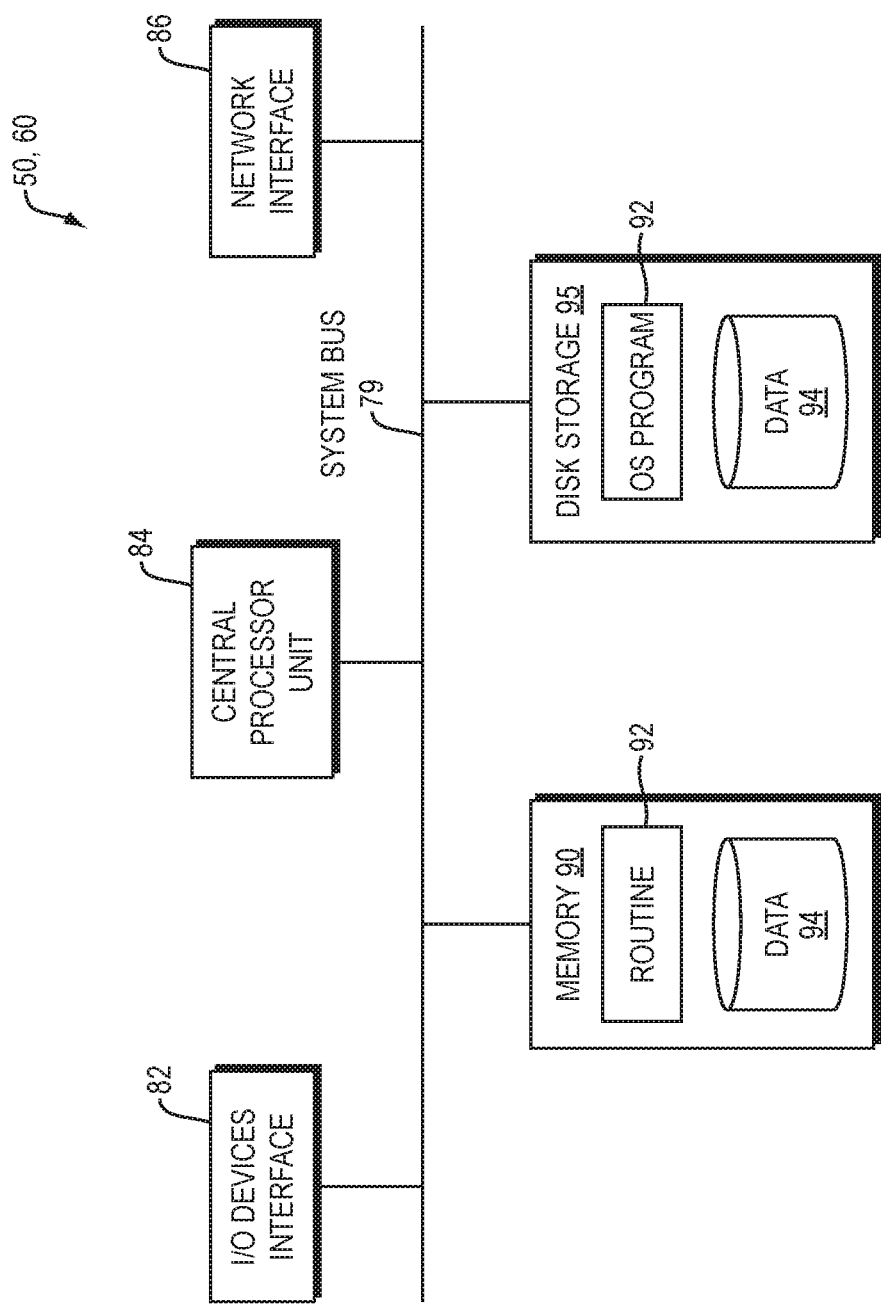
FIG. 11 is a diagram of an example internal structure of a computer (e.g., client processor/device or server computers) in the computer system of FIG. 10.

FIG. 11 is a diagram of an example internal structure of a computer (e.g., client processor/device 50 or server computers 60) in the computer system of FIG. 10. Each computer 50, 60 contains a system bus 79, where a bus is a set of hardware lines used for data transfer among the components of a computer or processing system. The system bus 79 is essentially a shared conduit that connects different elements of a computer system (e.g., processor, disk storage, memory, input/output ports, network ports, etc.) that enables the transfer of information between the elements. Attached to the system bus 79 is an I/O device interface 82 for connecting various input and output devices (e.g., keyboard, mouse, displays, printers, microphones, loudspeakers, etc.) to the computer 50, 60. A network interface 86 allows the computer to connect to various other devices attached to a network (e.g., network 70 of FIG. 10). Memory 90 provides volatile storage for computer software instructions 92 and data 94 used to implement an embodiment of the present invention (e.g., processing a speech signal, including analyzing a full spectral envelope to identify frequency content for desssing, and spectrally weighting the speech signal as a function of results of the analyzing, etc., as detailed above). Disk storage 95 provides non-volatile storage for computer software instructions 92 and data 94 used to implement an embodiment of the present invention. A central processor unit 84 is also attached to the system bus 79 and provides for the execution of computer instructions.

In one embodiment, the processor routines 92 and data 94 are a computer program product (generally referenced 92), including a non-transitory computer-readable medium (e.g., a removable storage medium such as one or more DVD-ROM's, CD-ROM's, diskettes, tapes, etc.) that provides at least a portion of the software instructions for the invention system. The computer program product 92 can be installed by any suitable software installation procedure, as is well known in the art. In another embodiment, at least a portion of the software instructions may also be downloaded over a cable communication and/or wireless connection. In other embodiments, the invention programs are a computer program propagated signal product 107 embodied on a propagated signal on a propagation medium (e.g., a radio wave, an infrared wave, a laser wave, a sound wave, or an electrical wave propagated over a global network such as the Internet, or other network(s)). Such carrier medium or signals may be employed to provide at least a portion of the software instructions for the present invention routines/program 92.

In alternative embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer.

Generally speaking, the term "carrier medium" or transient carrier encompasses the foregoing transient signals, propagated signals, propagated medium, storage medium and the like.

In other embodiments, the program product 92 may be implemented as a so-called Software as a Service (SaaS), or other installation or communication supporting end-users.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method of deessing a speech signal, the method comprising
   for each time frame of a speech signal presented to a speech processing system, analyzing a full spectral envelope to identify frequency content for deessing and spectrally weighting the speech signal as a function of results of the analyzing
   wherein spectrally weighting the speech signal includes applying deesser weights to sibilant sounds of the speech signal,
   wherein the method further comprises applying the deesser weights to control attack and release of a compressor, and
   wherein the compressor includes a soft threshold and a hard threshold, the soft threshold causing the compressor to moderate the further increase in a measure of sharpness for a given ratio R, the hard threshold being a not-to-exceed threshold of the measure of sharpness.

2. The method of claim 1, wherein spectrally weighting the speech signals occurs in the frequency domain and at a frequency resolution matching that of the full spectral envelope.

3. The method of claim 1, wherein analyzing the full spectral envelope includes calculating a psychoacoustic measure from the full spectral envelope.

4. The method of claim 3, wherein analyzing the full spectral envelope further includes detecting sibilant sounds of the speech signal using the psychoacoustic measure.

5. The method of claim 3, wherein the psychoacoustic measure includes at least one of a measure of sharpness and a measure of roughness.

6. The method of claim 3, wherein the psychoacoustic measure includes a measure of sharpness, and wherein analyzing the full spectral envelope further includes calculating deesser weights based on the measure of sharpness.

7. The method of claim 1, further comprising calculating the measure of sharpness including calculating a measure of sharpness without application of the deesser weights and calculating another measure of sharpness with application of the deesser weights.

8. The method of claim 7, wherein controlling the attack and release of the compressor includes, (i) if the measure of sharpness calculated with application of the deesser weights exceeds one of the thresholds of the compressor, adapting the deesser weights according to a gradient-descent method to attack those parts of the spectral envelope that dominate the measure of sharpness, otherwise, (ii) releasing the deesser weights.

9. A deesser of a speech processing system, the deesser comprising an analyzer and a compressor,
   wherein the analyzer is configured to receive a full spectral envelope for each time frame of a speech signal presented to the speech processing system and to analyze the full spectral envelope to identify frequency content for deessing
   wherein the compressor is configured to receive results from the analyzer and to spectrally weight the speech signal as a function of results of the analyzer,
   wherein the compressor is configured to spectrally weight the speech signal by applying deesser weights to sibilant sounds of the speech signal, and
   wherein the compressor includes a soft threshold and a hard threshold, the soft threshold causing the compressor to moderate the further increase in a measure of sharpness for a given ratio R, the hard threshold being a not-to-exceed threshold of the measure of sharpness.

10. The deesser of claim 9, wherein the analyzer is configured to calculate a psychoacoustic measure from the full spectral envelope.

11. The deesser of claim 10, wherein the analyzer is further configured to detect sibilant sounds of the speech signal using the psychoacoustic measure.

12. The deesser of claim 10, wherein the psychoacoustic measure includes a measure of sharpness, and wherein the analyzer is further configured to calculate deesser weights based on the measure of sharpness.

13. The deesser of claim 9, wherein the analyzer is configured to calculate at least two measures of sharpness, a measure of sharpness without application of the deesser weights and another measure of sharpness with application of the deesser weights.

14. The deesser of claim 13, wherein the compressor is configured to control attack and release of the compressor by, (i) if the measure of sharpness calculated with application of the deesser weights exceeds one of the thresholds of the compressor, adapting the deesser weights according to a gradient-descent method to attack those parts of the spectral envelope that dominate the measure of sharpness, otherwise, (ii) releasing the deesser weights.

* * * * *